(12) United States Patent
Zhao et al.

(10) Patent No.: US 11,508,440 B1
(45) Date of Patent: Nov. 22, 2022

(54) PERIODIC WRITE TO IMPROVE DATA RETENTION

(71) Applicant: SanDisk Technologies LLC, Addison, TX (US)

(72) Inventors: Dengtao Zhao, Los Gatos, CA (US); Ravi Kumar, Redwood City, CA (US); Chin-Yi Chen, San Jose, CA (US); Ryohei Shoji, Yokohama (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/323,708

(22) Filed: May 18, 2021

(51) Int. Cl.
| | |
|---|---|
| *G11C 16/24* | (2006.01) |
| *G11C 16/10* | (2006.01) |
| *G11C 16/14* | (2006.01) |
| *G11C 16/04* | (2006.01) |
| *G11C 16/34* | (2006.01) |
| *H01L 27/11582* | (2017.01) |

(52) U.S. Cl.
CPC .......... *G11C 16/10* (2013.01); *G11C 16/0483* (2013.01); *G11C 16/14* (2013.01); *G11C 16/349* (2013.01); *G11C 16/24* (2013.01); *H01L 27/11582* (2013.01)

(58) Field of Classification Search
CPC ..................................................... G11C 16/24
See application file for complete search history.

(56) References Cited

U.S. PATENT DOCUMENTS

| | | | |
|---|---|---|---|
| 7,746,715 B2 | 6/2010 | Van Duuren | |
| 8,009,482 B2 | 8/2011 | Wu et al. | |
| 9,378,832 B1 | 6/2016 | Lu et al. | |
| 9,720,616 B2 | 8/2017 | Yu et al. | |
| 10,304,543 B2 | 5/2019 | Senoo et al. | |
| 2014/0201598 A1 | 7/2014 | Chang | |
| 2019/0392901 A1* | 12/2019 | Lee | G11C 16/24 |

* cited by examiner

*Primary Examiner* — Jason Lappas
(74) *Attorney, Agent, or Firm* — Dickinson Wright PLLC; Steven C. Hurles (57) ABSTRACT

A nonvolatile memory control method includes a step of writing, repeatedly to a nonvolatile memory cells. The method continues with detecting when writing reaches a writing threshold value. Upon reaching the writing threshold, the method continues with driving a charge to at least one parasitic area intermediate at least two charge storage areas of the nonvolatile memory cells to improve data retention in at least one of the at least two charge storage areas of the nonvolatile memory cells.

20 Claims, 8 Drawing Sheets

PERIODIC WRITE TO IMPROVE DATA RETENTION

BACKGROUND

The present technology relates to the operation of memory devices. Semiconductor memory devices have become more popular for use in various electronic devices. For example, non-volatile semiconductor memory is used in cellular telephones, digital cameras, personal digital assistants, mobile computing devices, non-mobile computing devices and other devices. Such non-volatile memory typically includes a plurality of memory cells that are configured to hold a charge that corresponds with one of a plurality of data states. One known problem with some memory systems involves data retention during long times when the memory system is not active. In particular, the charge stored in a memory cell may change over time, thereby resulting in a read error. There is a continuing need for memory devices that offer not just improved efficiency and speed of operation but also improved data retention.

SUMMARY

Various embodiments are described herein for operating a nonvolatile memory, e.g., a NAND, a BICOS memory or the like. A memory can include a memory control circuitry and a plurality of memory cells to store data.

An aspect of the present disclosure is related to a nonvolatile memory control method that includes a step of writing, repeatedly to a nonvolatile memory cells. The method continues with detecting when writing reaches a writing threshold value. Upon reaching the writing threshold value, the method continues with driving at least a charge to at least one parasitic area intermediate at least two charge storage areas of the nonvolatile memory cells to improve data retention in at least one of the at least two charge storage areas of the nonvolatile memory cells.

In an embodiment, the step of driving a charge to the at least one parasitic area includes driving electrons into the parasitic area to reduce the charge gradient between the at least two charge storage areas of the nonvolatile memory cells.

In an embodiment, the driving a charge to the at least one parasitic area includes setting the word lines to a voltage level that is higher than a trim voltage level.

In an embodiment, the driving a charge to the at least one parasitic area includes driving the voltage level for about 5 ms.

In an embodiment, the writing threshold is 100 program operations.

In an embodiment, the driving a charge to the at least one parasitic area is a flash write operation.

In an embodiment, the driving a charge to the at least one parasitic area includes driving a charge that is less than an erase state of the nonvolatile memory cells and greater than a lowest state of a highest programmed state of the nonvolatile memory cells.

In an embodiment, the writing and driving are performed on a monolithic charge trapping layer across multiple sub-blocks.

In an embodiment, the driving a charge includes driving a negative charge to the parasitic area.

In an embodiment, the driving a charge includes driving electrons to the parasitic areas adjacent an erase state memory cell with only one parasitic area of the two adjacent the erase state memory cell being charged with electrons.

According to another aspect of the disclosure, a nonvolatile memory is provided. The nonvolatile memory includes a plurality of nonvolatile memory cells that are susceptible to diffusion of charge during a rest state. A controller is operably connected to the plurality of nonvolatile memory cells and is configured to write, repeatedly, to the plurality of nonvolatile memory cells. The controller is further configured to detect when writing reaches a writing threshold value and, upon reaching the writing threshold value, drive a charge to at least one parasitic area intermediate at least two charge storage areas of the nonvolatile memory cells to improve data retention in at least one of the at least two charge storage areas of the nonvolatile memory cells.

In an embodiment, the plurality of nonvolatile memory cells are arranged in a vertical string and adjacent memory cells share a layer as the charge trapping layer.

In an embodiment, the controller is further configured to drive electrons into the at least one parasitic area to reduce a charge gradient between the at least two charge storage areas of the nonvolatile memory cells.

In an embodiment, the controller is further configured to set word lines associated with the memory cells to program the parasitic areas to a voltage level of trim plus 6.5 volts and drive the voltage level for about 5 ms.

In an embodiment, the writing threshold is 100 program operations.

In an embodiment, the plurality of memory cells includes a charge trapping layer in a same layer as the parasitic areas.

In an embodiment, the controller is further configured to drive a charge into the at least one parasitic area to a level that is less than half of a charge in adjacent chare storage areas of the memory cells.

In an embodiment, the controller performs a flash write to drive charge into the at least one parasitic area.

In an embodiment, the controller performs stripe erase to remove fewer electrons from the at least one parasitic area than a flash erase when erasing the plurality of memory cells.

Yet another aspect of the present disclosure is related to an apparatus. The apparatus includes a plurality of nonvolatile memory cells with a continuous, monolithic charge trapping layer that has charge storage areas and parasitic areas that are susceptible to diffusion of charge during a rest state. The apparatus further includes a controller that is operably connected to the plurality of nonvolatile memory cells and is configured to write, repeatedly, to the plurality of nonvolatile memory cells. The controller is further configured to detect when a writing threshold value is reached. Upon reaching the writing threshold value, the controller is further configured to drive a charge to at least one parasitic area intermediate at least two charge storage areas of the nonvolatile memory cells to improve data retention in the at least two charge storage areas of the nonvolatile memory cells.

BRIEF DESCRIPTION OF THE DRAWINGS

A more particular description is included below with reference to specific embodiments illustrated in the appended drawings. Understanding that these drawings depict only certain embodiments of the disclosure and are not, therefore, to be considered limiting of its scope, the disclosure is described and explained with additional specificity and detail through the use of the accompanying drawings, in which.

DETAILED DESCRIPTION

Systems and methods are described for controlling the data retention and program operations of nonvolatile memory to improve data retention. Embodiments herein describe performing periodically a write program the word lines to improve data retention by injecting electrons into the parasitic areas between adjacent gates. In an example, the write program is performed before erase.

Many nonvolatile memory devices, e.g., vertically oriented NAND memories, bit cost scalable (BiCS) memory devices, have a continuous charge trapping layer across multiple different word lines. This structure can allow a charge to migrate from one location to another whenever possible, for example, during a data retention stage. The charge amount change will lead to a nominal threshold voltage (Vt) change, which can also cause word line interference in adjacent word lines in program operation. As feature sizes are scaled down with continuing advancements in memory systems, these problems can become worse. These problems also increase as memory cells store more bits, e.g., from two bits per cell to three bits per cell to four bits per cells. That is, the change in the Vt becomes worse for each increase in the number of bits per memory cell. This can be true for quad level cells (QLC) as compared to tri level cells (TLC) as the QLC has fifteen programmed data states and a Vt change for each data state will add up to a larger number than in the case of TLC.

Data retention is an important issue in electronic memory devices. For QLC memory devices, a Vt distribution across the fifteen programmed data states and the erase state is tight, and the Vt windows can be sensitive to voltage shifts.

In traditional memory systems, the charge trapping layer can be cut and not in contact with adjacent cells. The cut can be a kerf in the layer that is filled with an insulating material. However, this cannot be done in vertical memory stacks that are used in some memory devices. Embodiments described herein use flash write to drive charge into these areas to reduce the impact of charge migration. This write enable can be performed after a set number of write/erase operations. After a number of these write/erase cycling, the system can call for a flash write to drive charge into the areas of the layer between the memory cells. In an example, the flash write, the stripe erase, alternative erase verify can operate with an elevated read voltage (VREAD) on neighboring word line during erase verify. This is needed as some electrons are trapped in-between two neighboring word lines. Some of these electrons will be cleaned up during erase. All word line erase will remove more electrons from the parasitic area between word lines. Stripe erase will remove less electrons in the parasitic area. Stripe erase can be erase across multiple different sections of memory at a same level. The number of electrons trapped in the parasitic area determines neighboring word line interference (NWI) in full sequence programming mode. The number of electrons in the parasitic region not only effects full sequence program operations but will also effect other program operations, e.g., foggy-fine program operations. A greater the number of electrons trapped in-between two word lines reduce lateral electron diffusion through the parasitic area during data retention. By leaving the trapped electrons in the parasitic area, the electrons can assist in reducing lateral charge loss; thereby, increasing data retention. However, leaving those trapped electrons may make erase more difficult, e.g., due to increased parasitic resistance of the whole NAND chain. Accordingly, it may not be desirable to always drive electrons into the parasitic area.

Figure 1:
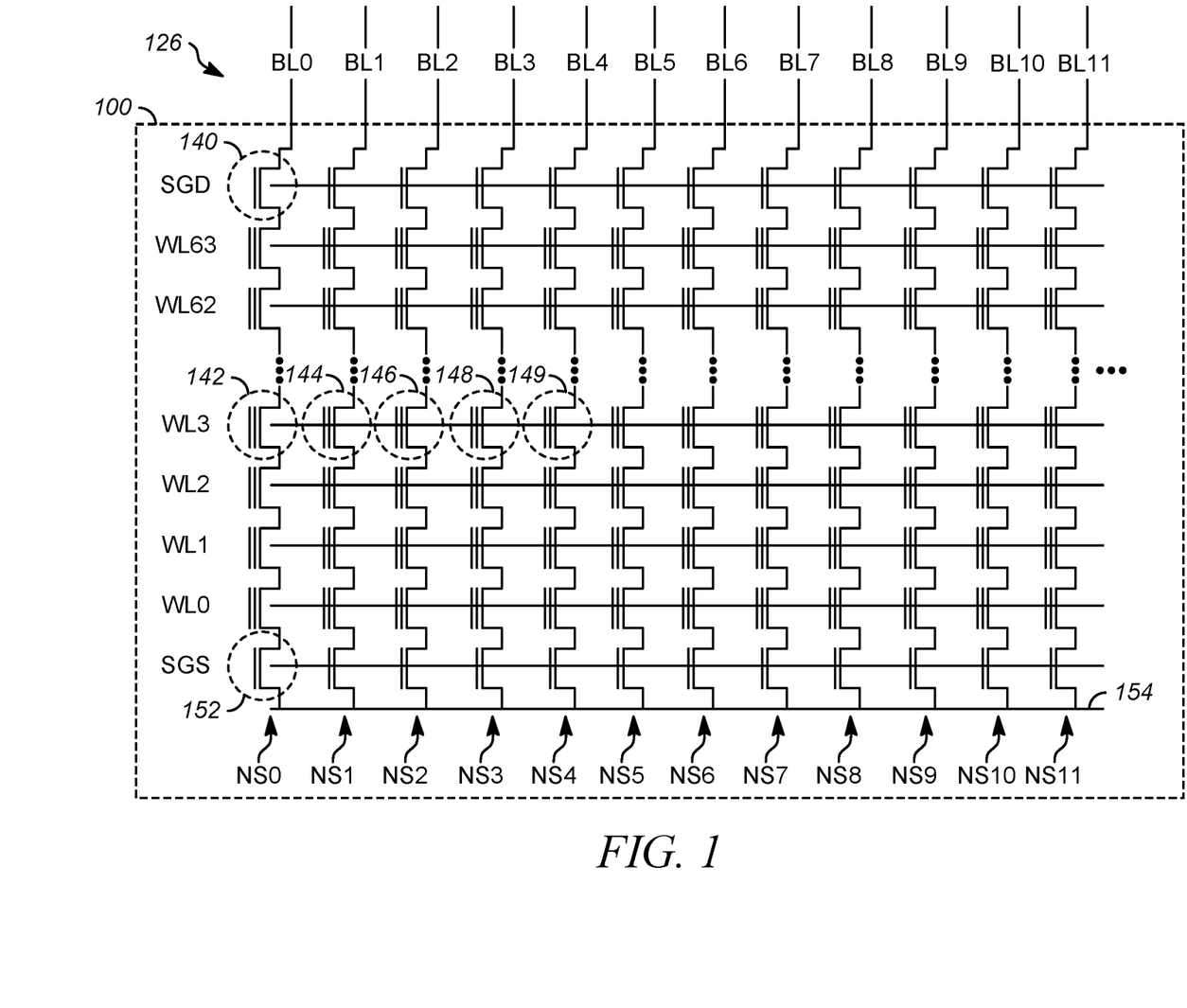
FIG. 1 illustrates an embodiment of an array of memory cells including bit and word lines according to an example embodiment.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory can be BiCS memory architecture. In an example embodiment, the memory includes shared storage layers across multiple strings of memory cells. Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple level cell (TLC) (3 bits-per-cell), a quad-level cell (QLC) (4 bits-per-cell), and so forth. The charge trapping layers shown in memory system 126 are a monolithic layer without breaks between adjacent memory cells. The parasitic area can be at the areas of breaks between the memory cells. This illustration is made for ease of showing the memory cell structures and the parasitic areas are between the memory cells.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty word lines. A sub-block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected memory cells which are selected for programming. Other storage elements connected to WL3 can also be selected storage elements. Sixty-four word lines, for example, WL0-WL63, extend between the source-side select gates and the drain-side select gates. The word lines WL0-WL63 can each be electrically connected to one or more control gate lines through an associated word line selection switch. The control gate lines can be precharged with the voltage charge level required at the word line for the next operation, e.g., read, program or erase. The word line switch electrically connects the control gate line to the word line and is controlled between its conducting state and its non-conducting state by the memory controller circuitry.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner. In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The memory cell is erased by injecting hot holes into the nitride. A similar memory cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

In an example embodiment, the nonvolatile memory device includes a memory block, a row decoder, a voltage generator and control logic. The memory block includes memory cells stacked in a direction intersecting a substrate (e.g., vertically), the memory block being divided into sub-blocks configured to be erased independently. The row decoder is configured to select the memory block by a sub-block unit. The sub-block unit can be used to define in a same area of the memory block or on a same level in the memory block structure.

Figure 2:
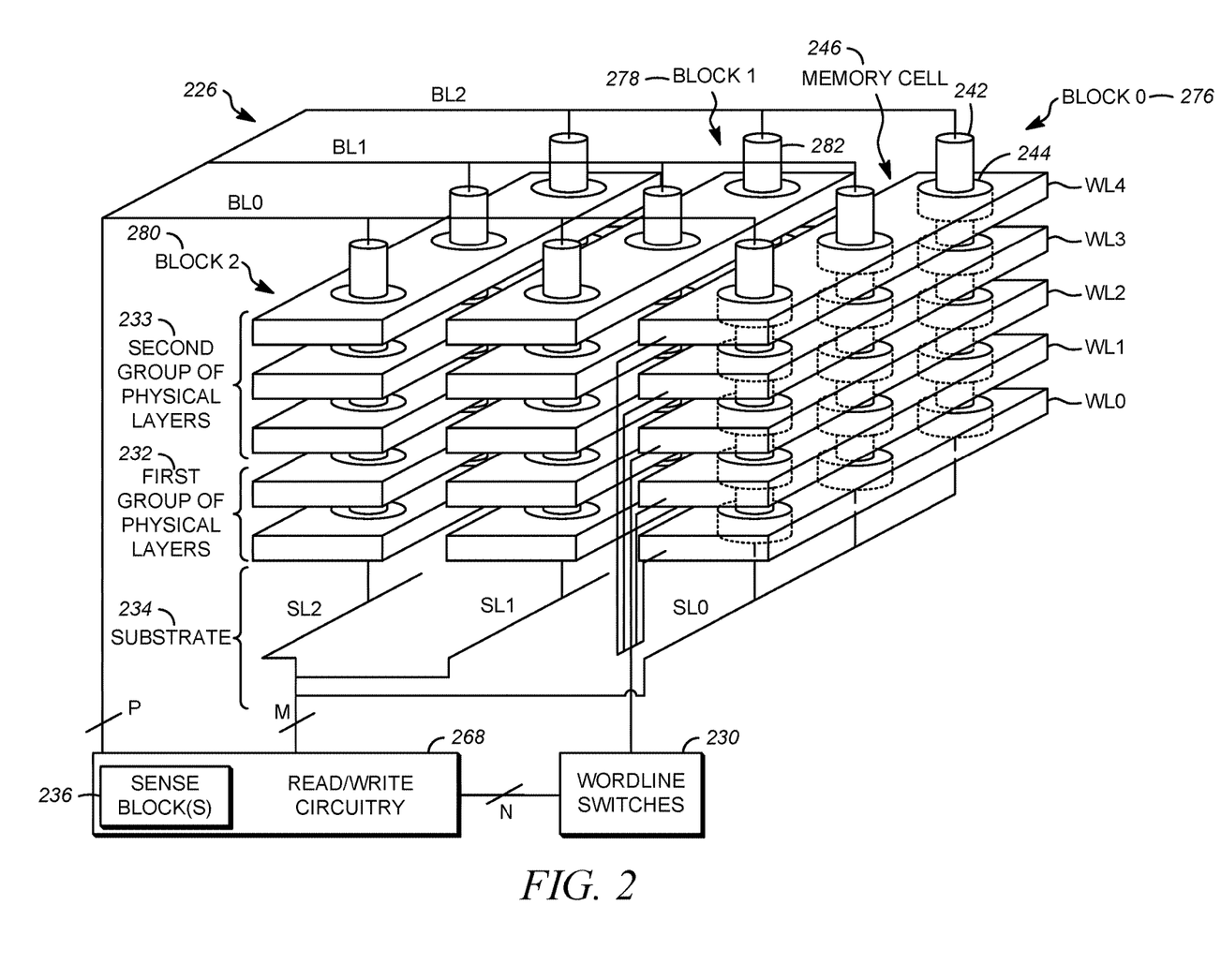
FIG. 2 illustrates a diagram of a three-dimensional (3D) memory in a NAND configuration according to an example embodiment.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block. Again the word lines are electrically connected to control gate lines through a word line selection switch.

Read/write circuitry 268, which can be part of controller circuitry, is coupled to the conductive channels via multiple conductive lines, illustrated as a first bit line BL0, a second bit line BL1. A third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as being coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIG. 2, P=3, M=3, and N=5. A plurality of word line switches are provided to connect a control line from the read/write circuitry to the word lines WL. The control gate lines can be precharged to a voltage level needed for the next operation on selected word lines WL with the word line switches in a non-conducting state. The word lines can be charged to an unselected level or to a selected level, depending on the state of the control lines, when the word line switches are in the conducting state.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4). The read/write circuitry 226 can also perform verify operations as part of the programming operation. The control gate lines coming from the controller circuitry are connected to the word lines by word line switches 230

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more sub-blocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
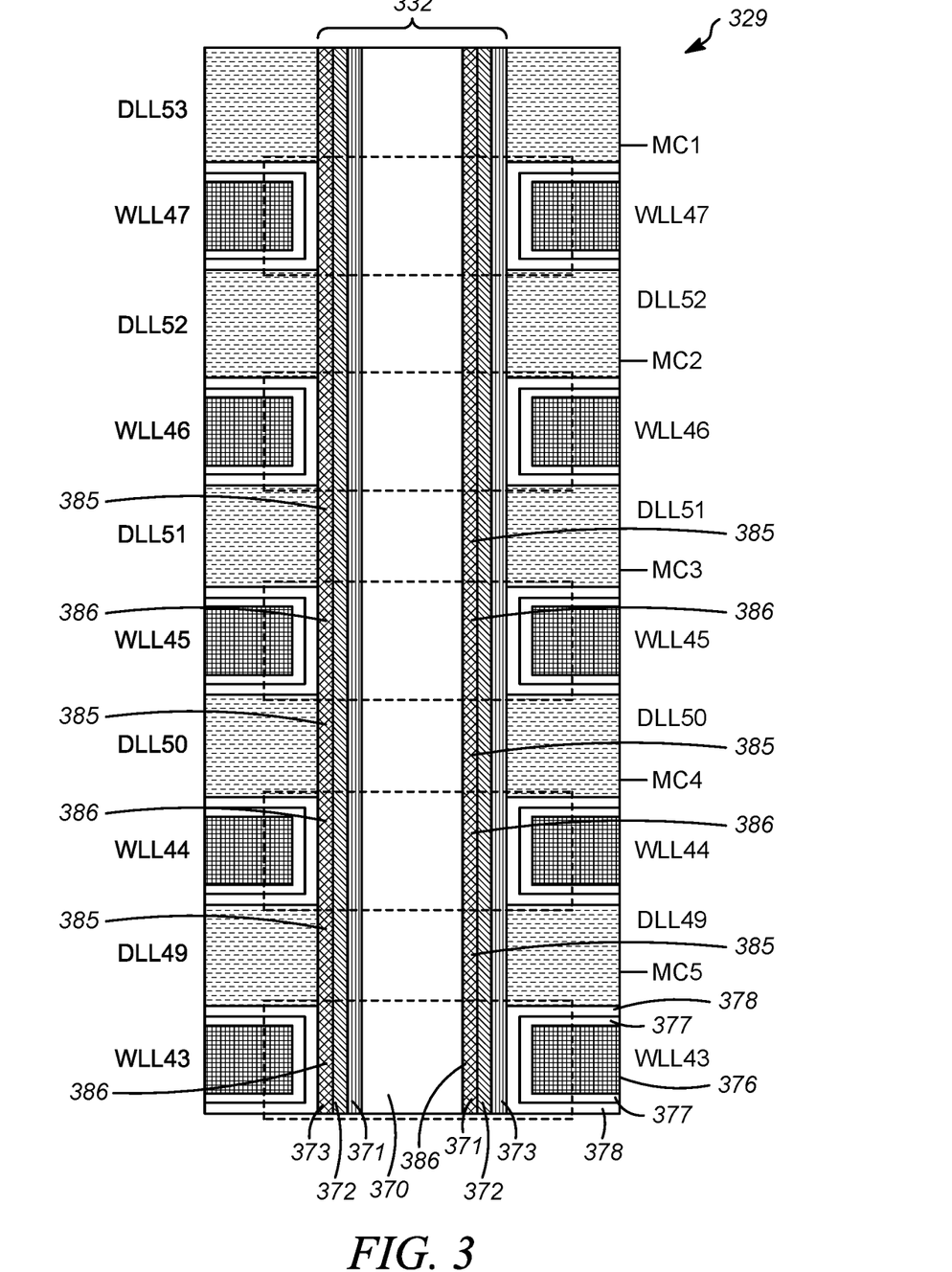
FIG. 3 illustrates a schematic block diagram illustrating an embodiment of a 3D vertical memory structure according to an example embodiment.

FIG. 3 illustrates one embodiment of a cross-sectional view of a 3D, vertical memory structure or string 329. In one embodiment, the vertical column 332 is round and includes four layers; however, in other embodiments more or fewer than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure. A parasitic area 385 is part of the shared charge-trapping layer 373 intermediate the word line structures. As shown in the memory structure 329 the parasitic areas are between the broken line boxes in FIG. 3. The parasitic areas 385 can store electrons such that there is a negative charge intermediate the charge storage areas 386. As described herein the negative charge in the parasitic areas 385 can assist in slowing charge dissipation and improve data retention. The data retention may be improved by decreasing the lateral diffusion of charge from the data storage areas 386. Additionally, the charge (the number of electrons) stored in the parasitic area contributes to the problem of neighboring word line interference.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer 373. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when two bits of data are stored per cell (MLC); three pages of data, such as when three bits of data are stored per cell (TLC); four pages of data, such as when four bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. In certain embodiments, four sets of strings 329 (e.g., four sets of forty-eight word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes forty-eight storage cells.

Figure 4A:
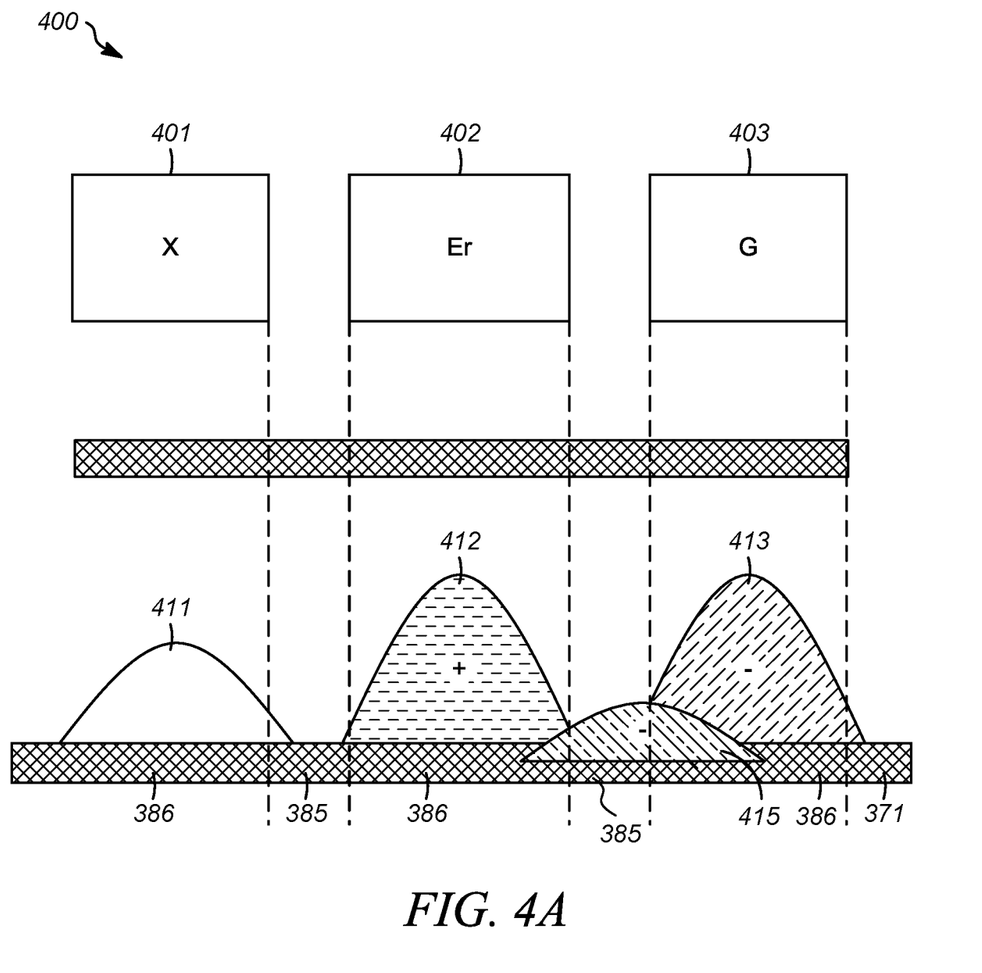
FIG. 4A illustrates a diagram showing a partial memory device according to an example embodiment.

FIG. 4A is a diagram 400 illustrating trapped charge levels in the parasitic areas between adjacent memory cells. The charge storage areas 386 are shown as storing charge in a memory cell, the X data state 401, the erase (Er) state 402, and the highest state of a TLC memory system (the G data state 413). Other states of the TLC memory cell (e.g., data states A-F) would have less charge stored therein. The X state represents any of the non-erase states in the memory cell, e.g., data states A-F. Having a charge state in the parasitic areas 385 between adjacent memory cells reduces charge leakage. The charge forced into the parasitic areas 385 can be less than the lowest data state, e.g., less than zero volts.

The sizes of the depictions of the charge levels 411, 412, 413, 415 illustrates the relative magnitude of the charge stored in the area. The charge level in the parasitic area is significantly smaller than the charge level in the G data state, e.g., twenty percent or less than the charge value in the G data state 403. The absolute value of charge level in the parasitic area is significantly smaller than the charge level in the erase Er state, e.g., twenty percent or less than the charge value in the Er state 402. In the charge states shown in the X data state, the charge gradient is not as great as between the Er and G states 402, 403. Accordingly, in some embodiments, there need not be electrons driven in the parasitic area between the X data state 401 and the Er state 402.

Figure 4B:
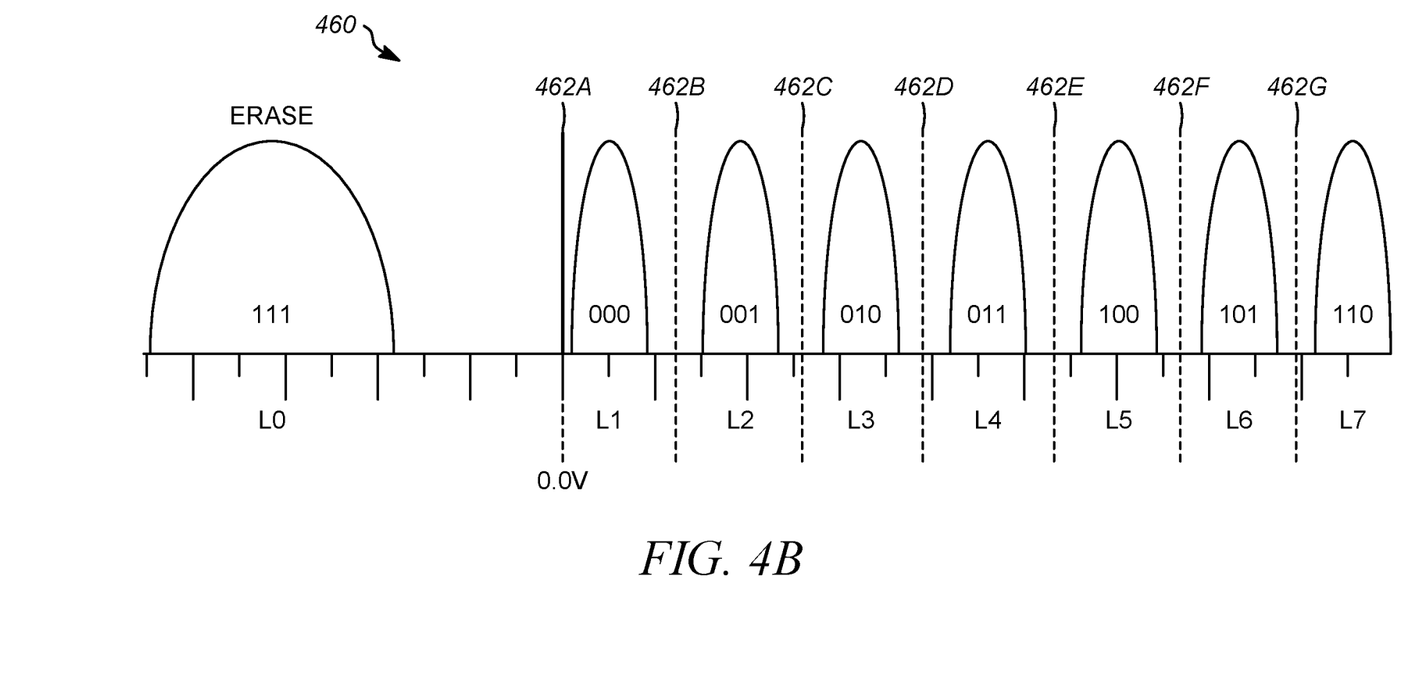
FIG. 4B illustrates a Vth distribution of TLC memory cells that have completed programming.

FIG. 4B is a schematic block diagram 460 illustrating one embodiment of configuration parameters 462A-462G for a set of TLC memory cells of non-volatile memory device, such as MLC NAND flash storage cells, or the like, with an example programming model. Performing a reliable read on TLC memory device, in certain embodiments, may be a more difficult task since a read window between program states L1-L7 may be narrower than in MLC memory device less than TLC. As wear-out effects start to change the cell characteristics, the read window may get smaller and more bit errors may be generated during reads as a result. The controller may read or sample data at predefined "retention points" (e.g., 1, 2, and 4 hours after programming). The X data state 401 in FIG. 4A can be any of the states except level 7 (G data state). If the charge is not maintained at the programmed level, the memory cell will not accurately store the data. Data retention techniques can be used to ensure the data is accurately stored. A data retention method can include programming a negative charge in the parasitic areas between adjacent memory cells to block lateral charge diffusion from the memory cells. The present example shows a TLC to illustrate memory levels. A QLC memory will have fifteen memory levels and an erase level and will operate similar to the description of the TLC.

Referring back to FIG. 4A, data retention is dependent on the charge concentration gradient. The greater the charge gradient, the faster the charge will laterally diffuse. The diagram 400 shows the largest gradient in a TLC, e.g., the erase state 402 with the highest positive charge and the G state 403 with the lowest charge state. The parasitic charge in the parasitic area 385 intermediate the storage area of the erase state 402 and the high state (G data state) 403. The trapped electrons in the parasitic area 385 are introduced by cycling in the program operations for the memory device or a flash write operation. In an example, a high voltage is placed on all word lines and the channel is grounded to introduce the charge into the parasitic area 385. In an example, the high voltage is greater than ten volts or greater than fifteen volts. In an example embodiment, the voltage on the word lines is Vpgm, e.g., about twenty volts, +/−one volt or two volts. The driving of charge (electrons) into the parasitic area 385 need not be performed on each program or write operation. In an example, the parasitic areas 385 are charged after a set number of write operations. In an example embodiment, the parasitic areas 385 are charged to reduce lateral diffusion between adjacent word line or memory cells when the controller knows that the memory cells will not be erased soon as having charge (electrons) in the parasitic areas 385 increases the parasitic resistance of the whole NAND string for an erase operation, thereby improving data retention.

In an example embodiment, the process to increase the negative charge in the parasitic areas can be controlled at the system level. A flash write operation (e.g., on a page of memory cells) is performed after a number of write operations. The write operations can be counted in the controller by counting the number of write enable signals. In an example, the flash write to charge the parasitic areas applies a voltage of trim +6.5 volts for a period of time. In an example, the period of time is between 4-6 ms or 5 ms. The number of times that a write operation occurs before driving charge into the parasitic area is greater than fifty write enable cycles. In an example, the number of cycles is one hundred or more, e.g., in QLC write cycles. In an example embodiment, a flash write, a stripe erase, and an alternative erase verify (EVFY) with an elevated VREAD on neighboring word lines are performed during erase verify. Stripe erase can be across multiple vertical strings at a same level or at a same level across multiple sub-blocks.

While an embodiment foresees Vpgm to drive a negative charge into the parasitic area to be trim +6.5 volts, other embodiment may use a different voltage level or different times. Some reduction of lateral diffusion can be found when the parasitic areas are charged using a flash write time of 4 ms to about 7 ms. The program voltage can be trim plus 5.0 volts, plus 5.5 volts, plus 7.0 volts, plus 8.0 volts, or plus 9.0 volts. The trim voltage level can be set by testing the individual memory device. The trim voltage level can be due to different characteristics from fabrication of the die comprising the memory device.

Other write/erase cycle numbers can trigger the memory controller to drive electrons into the parasitic area. In an example embodiment, the trim voltage can be in a range of tenths of volts to single digits of volts.

Figure 5:
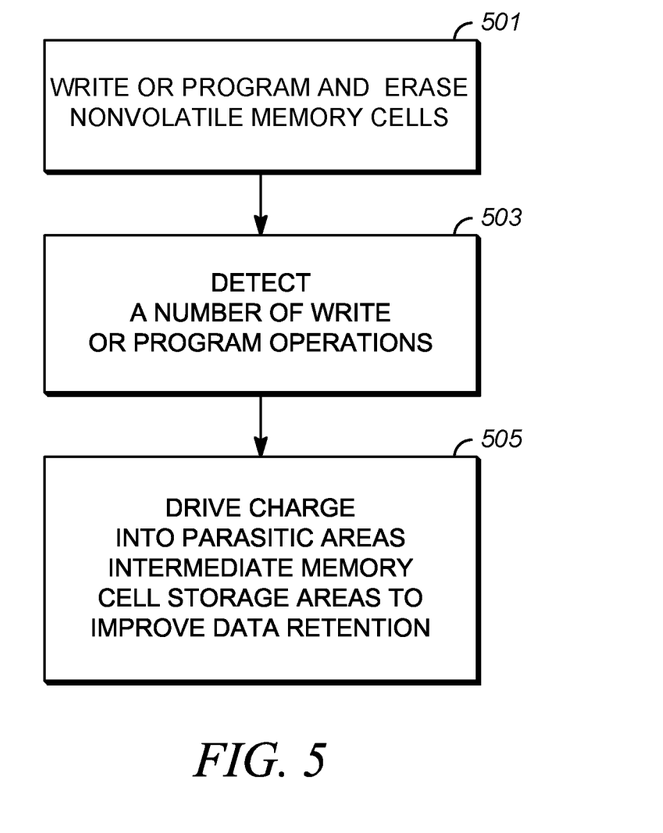
FIG. 5 illustrates a process flow chart according to an example embodiment.

FIG. 5 illustrates an example process flow 500 according to the present disclosure.

At step 501, the process 500 writes, repeatedly, to a plurality of nonvolatile memory cells to store data therein. The memory cells can be those described therein, e.g. MLC, TLC, or QLC.

At step 503, it is detected when a set number of write operations or program operations are performed. When the threshold value of these operations is reached, then the controller can flag the memory cells in a page of memory for a flash write operation.

At step 505, upon reaching the writing threshold, a charge is driven to at least one parasitic area intermediate at least two of charge storage areas of the nonvolatile memory cells. This can improve data retention in at least one of the at least two of charge storage areas of the nonvolatile memory cells.

In an example embodiment, driving electrons into the parasitic area reduces the charge gradient between at least one of the two of charge storage areas of the nonvolatile memory cells.

In an example embodiment, the driving a charge to at least one parasitic area includes setting the word lines for the flash write to a voltage level of trim plus 6.5 volts.

In an example embodiment, driving a charge to at least one parasitic area includes driving the voltage level for about 5 ms.

In an example embodiment, the writing threshold is at least 100 program operations and can be more, e.g., 200, 500 or 1,000 operations.

In an example embodiment, the driving a charge to at least one parasitic area is a flash write operation.

In an example embodiment, the driving a charge to at least one parasitic area includes driving a charge that is less than an erase state of the nonvolatile memory cells and greater than a lowest state of a highest programmed state of the nonvolatile memory cells.

In an example embodiment, the writing and the driving are performed on a monolithic charge trapping layer.

In an example embodiment, the driving a charge include driving a negative charge to the parasitic area.

In an example embodiment, the driving a charge includes driving electrons to parasitic areas adjacent an erase state memory cell with only one parasitic area of the two adjacent the erase state memory cell being charged with electrons.

Figure 6:
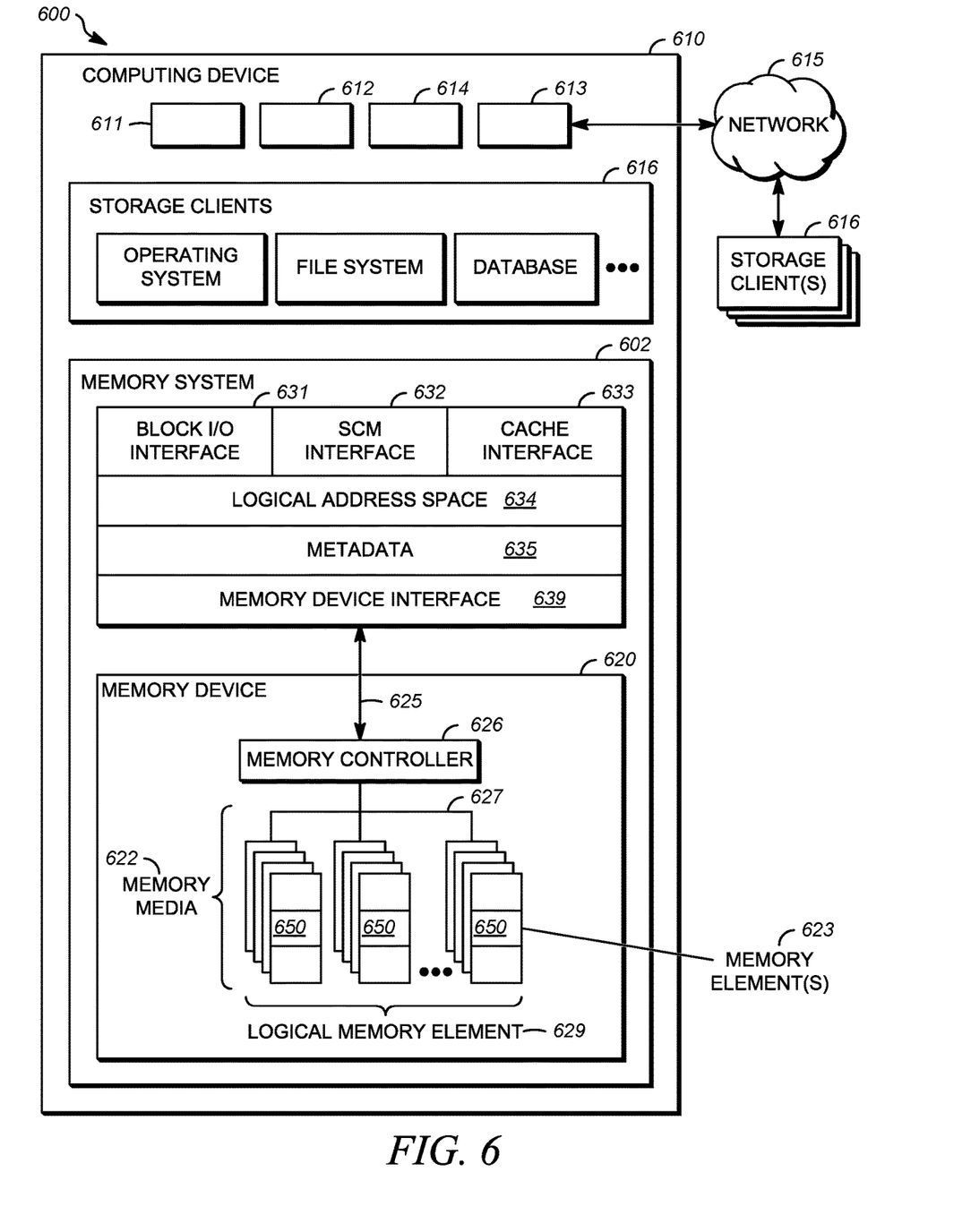
FIG. 6 illustrates a schematic block diagram illustrating an embodiment of a memory system according to an example embodiment.

FIG. 6 is a schematic block diagram illustrating an embodiment of a system 600 and device 610 for memory cell subgroup identification and selection. In some embodiments, a memory device 620 can at least partially operate on and/or in communication with a nonvolatile and/or volatile memory system 602 of a computing device 610, which can comprise a processor 611, volatile memory 612, and a communication interface 613. The processor 611 can comprise one or more central processing units, one or more general-purpose processors, one or more application-specific processors, one or more virtual processors (e.g., the computing device 610 can be a virtual machine operating within a host), one or more processor cores, or the like. The communication interface 613 can comprise one or more network interfaces configured to communicatively couple the computing device 610 and/or memory controller 626 to a communication network 615, such as an Internet Protocol (IP) network, a Storage Area Network (SAN), wireless network, wired network, or the like.

The memory device 620, in various embodiments, can be disposed in one or more different locations relative to the computing device 610. In one embodiment, the memory device 620 comprises one or more non-volatile and/or volatile memory elements 623, such as semiconductor chips or packages or other integrated circuit devices disposed on one or more printed circuit boards, storage housings, and/or other mechanical and/or electrical support structures. For example, the memory device 620 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 620 can be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, can be disposed on a memory bus of a processor 611 (e.g., on the same memory bus as the volatile memory 612, on a different memory bus from the volatile memory 612, in place of the volatile memory 612, or the like). In a further embodiment, the memory device 620 can be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 can be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

The computing device 610 can further comprise a non-transitory, computer readable storage medium 614. The computer readable storage medium 614 can comprise executable instructions configured to cause the computing device 610 (e.g., processor 611) to perform steps of one or more of the methods disclosed herein. In one embodiment, a subgroup selection circuit 650 can comprise hardware of a non-volatile and/or volatile memory element 623, computer executable program code of a device driver, firmware of a memory controller 626 and/or a memory media controller for a memory element 623, another electrical component, or the like. In one embodiment, a subgroup selection circuit 650 is integrated on a memory element 623 (e.g., an on-die subgroup selection circuit 650 and/or other integrated hardware).

According to various embodiments, a memory controller 626, e.g., memory controller circuitry, can manage one or more memory devices 620 and/or memory elements 623, one or more of which can comprise an on-die subgroup selection circuit 650. The memory device(s) 620 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units and/or regions can include, but are not limited to: pages, memory divisions, blocks, sectors, collections or sets of physical storage locations (e.g., logical pages, logical blocks), or the like.

The controller 626 can perform a stripe erase, e.g., upon receiving data to be written from the controller 626 caches the data in RAM until a quantity of data sufficient to fill a data "stripe" has been cached. Controller 626 is then configured to partition the cached data into a number of portions corresponding to the number of channels available for data in a stripe, minus a number of channels to be used for error correction information. Controller 626 is configured to generate error correction information based on the portions of data, and to write both the data portions and the error correction information to data segments in separate channels of the stripe. For example, upon caching sufficient data to populate seven of the eight data segments in a stripe, controller 626 partitions the cached data into seven portions. A stripe can be the same level across multiple pages or multiple vertical memory strings at a same level.

A device driver and/or the memory controller 626, in certain embodiments, can present a logical address space 634 to the storage clients 616. As used herein, a logical address space 634 refers to a logical representation of memory resources. The logical address space 634 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an Inode, a Universally Unique Identifier (UUID), a Globally Unique Identifier (GUID), a hash code, a signature, an index entry, a range, an extent, or the like.

A device driver for the memory device 620 can maintain metadata 635, such as a logical to physical address mapping structure to map logical addresses of the logical address space 634 to media storage locations on the memory device(s) 620. A device driver can be configured to provide storage services to one or more storage clients 616. The storage clients 616 can include local storage clients 616 operating on the computing device 610 and/or remote storage clients 616 accessible via the network 615 and/or network interface 613. The storage clients 616 can include, but are not limited to: operating systems, file systems, database applications, server applications, kernel-level processes, user-level processes, applications, and the like.

A device driver can be communicatively coupled to one or more memory devices 620. The one or more memory devices 620 can include different types of memory devices including, but not limited to: solid-state storage devices, semiconductor storage devices, SAN storage resources, volatile memory devices, non-volatile memory devices, or the like. The one or more memory devices 620 can comprise one or more respective memory media controllers 626 and memory media 622. A device driver can provide access to the one or more memory devices 620 via a traditional block I/O interface 631. Additionally, a device driver can provide access to enhanced functionality through the SCM interface 632. The metadata 635 can be used to manage and/or track data operations performed through any of the Block I/O interface 631, SCM interface 632, cache interface 633, or other related interfaces.

The cache interface 633 can expose cache-specific features accessible via a device driver for the memory device 620. Also, in some embodiments, the SCM interface 632 presented to the storage clients 616 provides access to data transformations implemented by the one or more memory devices 620 and/or the one or more memory media controllers 626.

A device driver can present a logical address space 634 to the storage clients 616 through one or more interfaces. As discussed above, the logical address space 634 can comprise a plurality of logical addresses, each corresponding to respective media locations on one or more memory devices 620. A device driver can maintain metadata 635 comprising any-to-any mappings between logical addresses and media locations, or the like.

A device driver can further comprise and/or be in communication with a memory device interface 639 configured to transfer data, commands, and/or queries to the one or more memory devices 620 over a bus 625, which can include, but is not limited to: a memory bus of a processor 611, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 615, InfiniBand, SCSI RDMA, or the like. The memory device interface 639 can communicate with the one or more memory devices 620 using input-output control (IO-CTL) command(s), IO-CTL command extension(s), remote direct memory access, or the like.

The communication interface 613 can comprise one or more network interfaces configured to communicatively couple the computing device 610 and/or the memory controller 626 to a network 615 and/or to one or more remote, network-accessible storage clients 616. The storage clients 616 can include local storage clients 616 operating on the computing device 610 and/or remote storage clients 616 accessible via the network 615 and/or the network interface 613. The memory controller 626 is part of and/or in communication with one or more memory devices 620. Although FIG. 6 depicts a single memory device 620, the disclosure is not limited in this regard and could be adapted to incorporate any number of memory devices 620, a combination of one or more volatile memory devices 620 and one or more non-volatile memory devices 620, or the like.

The memory device 620 can comprise one or more elements 623 of memory media 622. In one embodiment, an element 623 of memory media 622 comprises a volatile memory medium 622, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 623 of memory media 622 comprises a non-volatile memory medium 622, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 620 may rely, for example, on stored voltage levels or stored resistance levels. The one or more elements 623 of memory media 622, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 623 of ReRAM, memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 622 is referred to herein as "memory media," in various embodiments, the non-volatile memory media 622 can more generally comprise one or more non-volatile recording media capable of recording data, which can be referred to as a non-volatile memory medium, a non-volatile storage medium, or the like. Further, the nonvolatile memory device 620, in various embodiments, can comprise a non-volatile recording device, a non-volatile memory device, a non-volatile storage device, or the like. Similarly, a nonvolatile memory element 623, in various embodiments, can comprise a non-volatile recording element, a non-volatile memory element, a non-volatile storage element, or the like.

The non-volatile memory media 622 can comprise one or more non-volatile memory elements 623, which can include, but are not limited to: chips, packages, planes, die, or the like. A non-volatile memory controller 626 can be configured to manage data operations on the nonvolatile memory media 622, and can comprise one or more processors, programmable processors (e.g., FPGAs), ASICs, micro-controllers, or the like. In some embodiments, the nonvolatile memory controller 626 is configured to store data on and/or read data from the nonvolatile memory media 622, to transfer data to/from the non-volatile memory device 620, and so on.

The non-volatile memory controller 626 can be communicatively coupled to the non-volatile memory media 622 by way of a bus 627. The bus 627 can comprise an I/O bus for communicating data to/from the non-volatile memory elements 623. The bus 627 can further comprise a control bus for communicating addressing, and other command and control information to the non-volatile memory elements 623. In some embodiments, the bus 627 can communicatively couple the non-volatile memory elements 623 to the non-volatile memory controller 626 in parallel. This parallel access can allow the non-volatile memory elements 623 to be managed as a group, forming a logical memory element 629. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 626 can comprise and/or be in communication with a device driver executing on the computing device 610. A device driver can provide storage services to the storage clients 616 via one or more interfaces 631, 632, and/or 633. In some embodiments, a device driver provides a block-device I/O interface 631 through which storage clients 616 perform block-level I/O operations. Alternatively, or in addition, a device driver can provide a storage class memory (SCM) interface 632, which can provide other storage services to the storage clients 616. In some embodiments, the SCM interface 632 can comprise extensions to the block device interface 631 (e.g., storage clients 616 can access the SCM interface 632 through extensions or additions to the block device interface 631). Alternatively, or in addition, the SCM interface 632 can be provided as a separate API, service, and/or library. A device driver can be further configured to provide a cache interface 633 for caching data using the non-volatile memory system 602. A device driver can further comprise a non-volatile memory device interface 639 that is configured to transfer data, commands, and/or queries to the non-volatile memory controller 626 over a bus 625, as described above.

Figure 7:
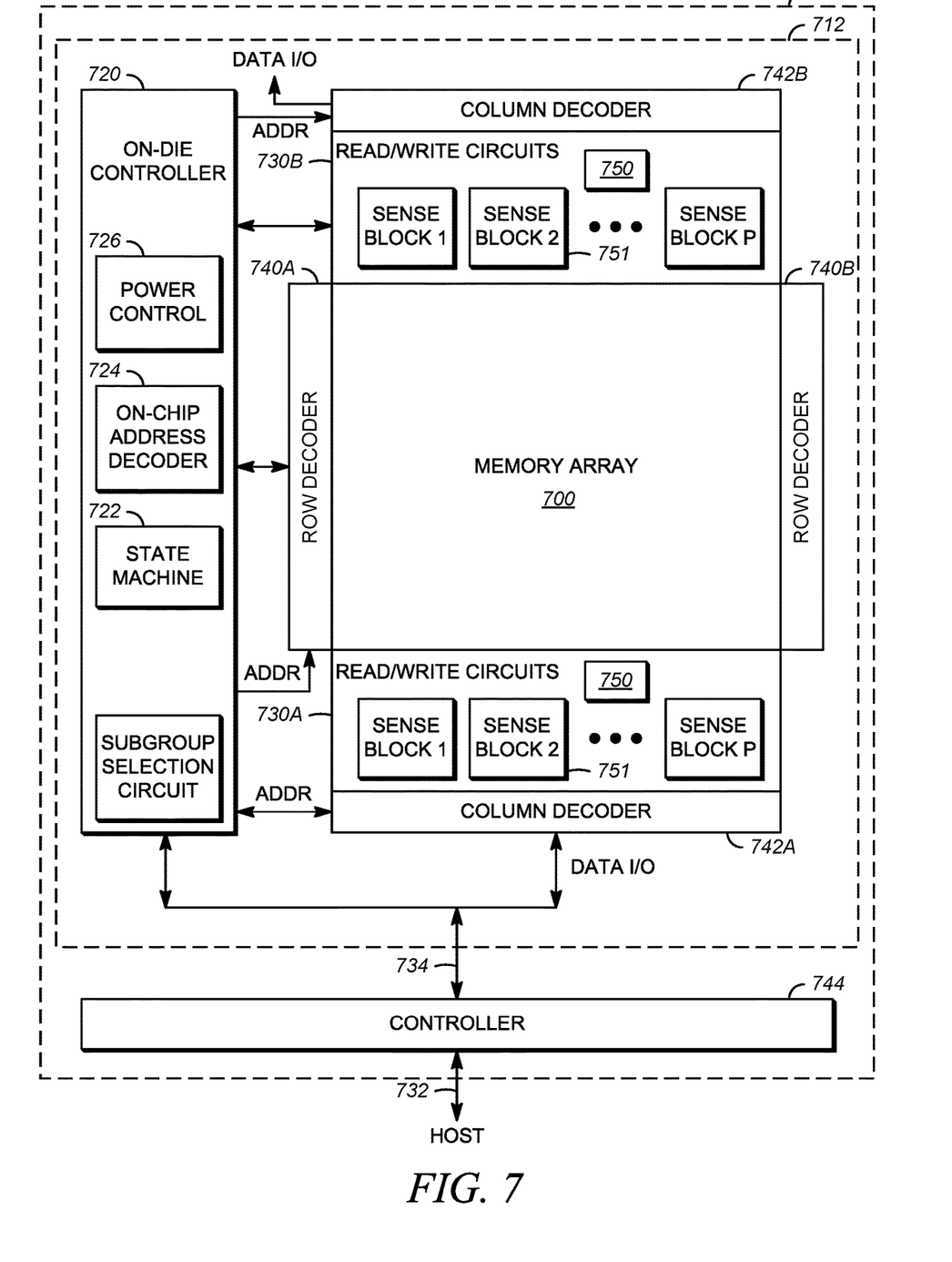
FIG. 7 illustrates a schematic block diagram of non-volatile storage device for memory cell subgroup identification and selection according to an example embodiment.

The memory controller 626, which can be non-volatile memory circuitry for NAND memory devices, can act to implement the memory methodologies described herein. The controller 626 can FIG. 7 is a schematic block diagram illustrating an embodiment of a non-volatile storage device 710, which can perform programming and verify operations as described herein. The non-volatile storage device 710 can include one or more memory die or chips 712A "memory die" comprises a block of semiconducting material on which a memory circuit is fabricated and, as used herein, also includes the memory circuit disposed thereon. The nonvolatile storage device 710 can be substantially similar to the computing device 610 described with reference to FIG. 6.

The memory die 712, in some embodiments, includes an array 700 (e.g., two-dimensional or three dimensional) of memory cells, an on-die controller 720, and read/write circuits 730A/730B. In one embodiment, access to the memory array 700 by the various peripheral circuits is implemented in a symmetric fashion, on opposite sides of the memory array 700, so that the densities of access lines and circuitry on each side are reduced by half. The read/write circuits 730A/730B, in a further embodiment, include multiple sense blocks 751 which allow a page of memory cells to be read or programmed in parallel.

The memory array 700, in various embodiments, is addressable by word lines via row decoder circuits 740A/740B and by bit lines via column decoder circuits 742A/742B. In some embodiments, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

On-die controller 720, in one embodiment, cooperates with the read/write circuits 730A/730B to perform memory operations on the memory array 700. The on-die controller 720, in certain embodiments, includes a state machine 722, an on-chip address decoder 724, and a power control circuit 726. In one embodiment, the on-chip address decoder 724 and/or the power control circuit 726 can be part of and/or controlled by the controller 744. The on-die controller 720 an operate to select certain single tiers for certain program verify levels and multiple tiers for other program verify levels.

The state machine 722, in one embodiment, provides chip-level control of memory operations. The on-chip address decoder 724 provides an address interface to convert between the address that is used by the host or a memory controller to the hardware address used by the decoder circuits 740A, 740B, 742A, 742B. The power control circuit 726 controls the power and voltages supplied to the word lines and bit lines during memory operations. In one embodiment, the power control circuit 726 includes one or more charge pumps that can create voltages larger than the supply voltage. The state machine can be used to count the bitscans and compare the result to the threshold value, which can be stored in the state machine. The state machine can also trigger the program verify operation to skip to the next memory level verify operation when the bitscan count exceeds the threshold value.

In an embodiment, one or any combination of the on-die controller 720, state machine 722, power control circuit 726, on-chip address decoder 724, decoder circuit 742 A, decoder circuit 742B, decoder circuit 740 A, decoder circuit 740B, read/write circuits 730 A, read/write circuits 730B, and/or controller 744 can be referred to as one or more managing circuits or generally as a controller circuitry. In an example embodiment, the controller circuitry can include the word line switches electrically connected and isolating the word lines from the control gate lines.

Computer program code for carrying out operations for aspects of the present disclosure can be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like. A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit or circuitry, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In an embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited. Thus, the terms "including," "comprising," "having," and variations thereof signify "including but not limited to" unless expressly specified otherwise. The terms "a," "an," and "the" also refer to "one or more" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

Aspects of the present disclosure are described herein with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

As used herein, a "memory cell" comprises a hardware component that may store a single state. The memory cell may comprise a volatile or a non-volatile memory cell. The state stored in memory cell may represent one of various types of values, such as a single-bit value or a multi-bit value.

In the preceding detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure can refer to elements of proceeding figures. Like numbers can refer to like elements in the figures, including alternate embodiments of like elements.

It is believed that the use of the parasitic area charge will reduce lateral charge diffusion and improve the threshold voltage (Vt) by about 150 mVolts in a QLC device relative to not having a controlled negative charge in the parasitic areas.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A nonvolatile memory control method, comprising:
 writing, repeatedly, to a plurality of nonvolatile memory cells;
 detecting when writing reaches a writing threshold value; and
 upon reaching the writing threshold value, driving at least a charge to at least one parasitic area intermediate at least two charge storage areas of the nonvolatile memory cells to improve data retention in at least one of the at least two charge storage areas of the nonvolatile memory cells.

2. The method of claim 1, wherein the driving a charge to the at least one parasitic area includes driving electrons into the parasitic area to reduce a charge gradient between the at least two charge storage areas of the nonvolatile memory cells.

3. The method of claim 2, wherein the driving a charge to the at least one parasitic area includes setting the word lines to a voltage level that is higher than a trim voltage level.

4. The method of claim 3, wherein the driving a charge to at least one parasitic area includes driving the voltage level for about 5 ms.

5. The method of claim 1, wherein the writing threshold is a few program operations; the threshold varies from different processes, device cell structures, and device operation modes.

6. The method of claim 1, wherein the driving a charge to the at least one parasitic area is a flash write operation.

7. The method of claim 1, wherein the driving a charge to the at least one parasitic area includes driving a charge that is less than an erase state of the nonvolatile memory cells and greater than a lowest state of a highest programmed state of the nonvolatile memory cells.

8. The method of claim 1, wherein the writing and the driving are performed on a monolithic charge trapping layer across multiple sub-blocks.

9. The method of claim 1, wherein the driving a charge includes driving a negative charge to the parasitic area.

10. The method of claim 1, wherein the driving a charge includes driving electrons to parasitic areas adjacent an erase state memory cell with only one parasitic area of the two adjacent the erase state memory cell being charged with electrons.

11. A nonvolatile memory, comprising:
 a plurality of nonvolatile memory cells, which are susceptible to diffusion of charge during a rest state; and
 a controller operably connected to the plurality of nonvolatile memory cells and configured to:
 write, repeatedly, to the plurality of nonvolatile memory cells;
 detect when writing reaches a writing threshold value; and
 upon reaching the writing threshold value, drive a charge to at least one parasitic area intermediate at least two charge storage areas of the nonvolatile memory cells to improve data retention in at least one of the at least two charge storage areas of the nonvolatile memory cells.

12. The nonvolatile memory of claim 11, wherein the plurality of nonvolatile memory cells are arranged in a vertical string and adjacent memory cells share a layer as the charge trapping layer.

13. The nonvolatile memory of claim 11, wherein the controller is further configured to drive electrons into the at least one parasitic area to reduce a charge gradient between the at least two charge storage areas of the nonvolatile memory cells.

14. The nonvolatile memory of claim 13, wherein the controller is further configured to set word lines associated with memory cells to program the parasitic areas to a voltage level of trim plus 6.5 volts and drive the voltage level for about 5 ms.

15. The nonvolatile memory of claim 11, wherein the writing threshold is 100 program operations.

16. The nonvolatile memory of claim 11, wherein the plurality of memory cells include a charge trapping area in a same layer as the parasitic areas.

17. The nonvolatile memory of claim 11, wherein the controller is further configured to drive charge into the parasitic areas to a level that is less than half of a charge in adjacent charge storage areas of the memory cells.

18. The nonvolatile memory of claim 11, wherein the controller performs a flash write to drive charge into the at least one parasitic area.

19. The nonvolatile memory of claim 11, wherein the controller performs stripe erase to remove fewer electrons from the at least one parasitic area than a flash erase when erasing the plurality of memory cells.

20. An apparatus, comprising:
a plurality of nonvolatile memory cells with a continuous, monolithic charge trapping layer having charge storing areas and parasitic areas, which are susceptible to diffusion of charge during a rest state; and
a controller operably connected to the plurality of nonvolatile memory cells and configured to:
write, repeatedly, to the plurality of nonvolatile memory cells;
detect when a writing threshold value is reached; and
upon reaching the writing threshold value, drive a charge to at least one parasitic area intermediate at least two charge storage areas of the nonvolatile memory cells to improve data retention in at least one of the at least two charge storage areas of the nonvolatile memory cells.

* * * * *